US012787498B2

(12) United States Patent
Liu et al.

(10) Patent No.: US 12,787,498 B2
(45) Date of Patent: Nov. 3, 2026

(54) LIGHT EMITTING DEVICE

(71) Applicant: XIAMEN SAN'AN OPTOELECTRONICS CO., LTD., Xiamen (CN)

(72) Inventors: Shiwei Liu, Xiamen (CN); Jin Xu, Xiamen (CN); Baojun Shi, Xiamen (CN); Shuijie Wang, Xiamen (CN); Ke Liu, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 343 days.

(21) Appl. No.: 18/509,965

(22) Filed: Nov. 15, 2023

(65) Prior Publication Data

US 2024/0088327 A1 Mar. 14, 2024

Related U.S. Application Data

(63) Continuation-in-part of application No. PCT/CN2021/102433, filed on Jun. 25, 2021.

(51) Int. Cl.
*H01L 33/10* (2010.01)
*H10H 20/814* (2025.01)

(52) U.S. Cl.
CPC .................................. *H10H 20/814* (2025.01)

(58) Field of Classification Search
CPC .................................................... H10H 20/814
See application file for complete search history.

(56) References Cited

U.S. PATENT DOCUMENTS

2013/0058102 A1* 3/2013 Lin ...................... H10H 20/841 362/296.04
2014/0138731 A1* 5/2014 Nakamura ........... H10H 20/835 257/98
2019/0237630 A1* 8/2019 Check ................ H10H 20/8312
2019/0371967 A1* 12/2019 Kim ..................... H10H 20/825

FOREIGN PATENT DOCUMENTS

CN 111146321 A 5/2020
CN 111788702 A 10/2020

OTHER PUBLICATIONS

Search Report issued to PCT application No. PCT/CN2021/102433 on Mar. 22, 2022.

* cited by examiner

*Primary Examiner* — Peniel M Gumedzoe
(74) *Attorney, Agent, or Firm* — Muncy, Geissler, Olds & Lowe, P.C.

(57) ABSTRACT

A light emitting device includes a light-emitting laminate and an insulating reflective structure. The insulating reflective structure includes n pairs of dielectric layers stacked on the light-emitting laminate. Each of the n pairs of dielectric layers includes a first material layer and a second material layer. The first material layer has a first refractive index, and the second material layer has a second refractive index that is greater than the first refractive index of the first material layer. For each pair of dielectric layers among m1 pairs of dielectric layers out of the n pairs of dielectric layers, the first material layer has an optical thickness that is greater than that of the second material layer, where 0.5n≤m1≤n, and n and m1 are natural numbers greater than 0.

18 Claims, 6 Drawing Sheets

LIGHT EMITTING DEVICE

CROSS-REFERENCE TO RELATED APPLICATION

This application is a continuation-in-part (CIP) of International Application No. PCT/CN2021/102433, filed on Jun. 25, 2021, which is incorporated herein by reference in its entirety.

FIELD

The disclosure relates to a light-emitting device (LED), a light-emitting apparatus, a display device, and a lighting equipment.

BACKGROUND

With the development of Mini-LED backlighting in the display technology, Mini-LEDs, especially wide-angle (WA) Mini-LEDs, have captured the public's attention. Since the WA Mini-LEDs can emit light with a broader range of light-emitting angles, the WA Mini-LEDs have improved light-emission uniformity. As compared to conventional LEDs, the WA Mini-LEDs, when used in applications such as a backlight panel, may be arranged in fewer numbers and eliminate the need for additional elements for light distribution, thereby reducing manufacturing cost. Notwithstanding, control of light-emitting angle is critical and challenging for Mini-LED manufacturing. In order to achieve a broad range of light-emitting angle, current WA Mini-LEDs generally include a metal layer and a distributed Bragg reflector (DBR) structure that are disposed on an emission surface of the current WA Mini-LEDs, so as to control light-emission from lateral sides of the current WA Mini-LEDs. In such configuration, however, due to light-absorption by an epitaxial structure, the metal layer, and the like during multiple times of reflection, luminous efficiency of the current WA Mini-LEDs is greatly reduced. On the other hand, during manufacturing of semiconductor light-emitting devices, laser stealth dicing is generally conducted to obtain separate and final products of the semiconductor light-emitting devices. In regard to a small-size light-emitting device that has a thin substrate with a thickness, particularly, not greater than 80 μm, an entire laminate of the to-be formed semiconductor light-emitting devices, before dicing, tends to warp due to having the thin substrate. Therefore, when stealth dicing is performed, problems usually occur since dicing laser (with wavelength ranging from 1000 nm to 1300 nm) cannot accurately target the desired depth within the substrate, thereby resulting in failure of stealth dicing.

SUMMARY

Therefore, an object of the disclosure is to provide a light-emitting device that can alleviate at least one of the drawbacks of the prior art.

According to the disclosure, the light-emitting device includes a light-emitting laminate and a first insulating reflective structure. The first insulating reflective structure includes n pairs of dielectric layers stacked on the light-emitting laminate. Each of the n pairs of dielectric layers includes a first material layer and a second material layer. The first material layer has a first refractive index, and the second material layer has a second refractive index that is greater than the first refractive index of the first material layer. For each pair of dielectric layers among m1 pairs of dielectric layers out of the n pairs of dielectric layers, the first material layer has an optical thickness that is greater than an optical thickness of the second material layer, where $0.5n \leq m1 \leq n$, and n and m1 are natural numbers greater than 0.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1A:
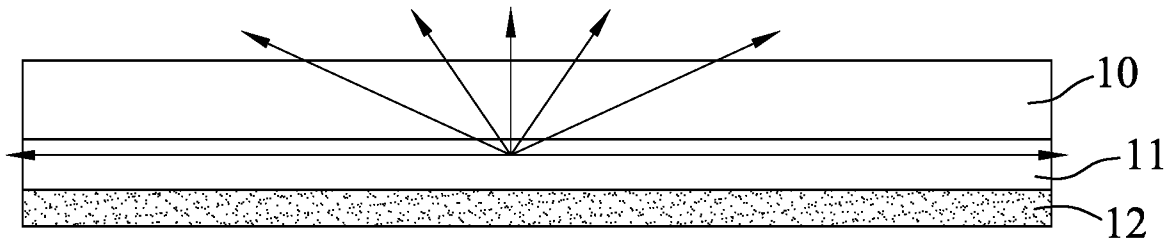
FIG.1A PRIOR ART
FIG. 1A is a schematic structural view of a conventional LED.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 1B:
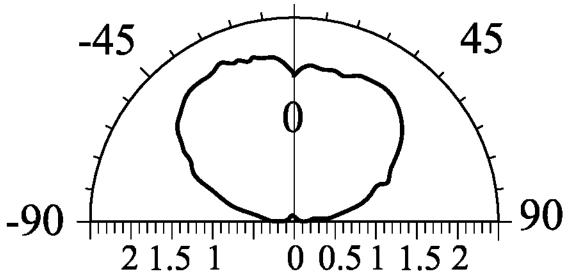
FIG.1B PRIOR ART
FIG. 1B is a light distribution curve of the conventional LED shown in FIG. 1A.
Figure 2A:
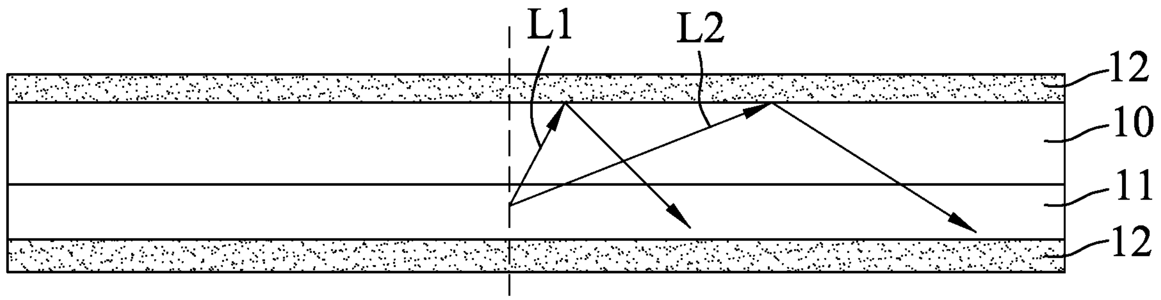
FIG.2A PRIOR ART
FIG. 2A is a schematic structural view of a conventional LED containing an epitaxial layer and a distributed Bragg reflector (DBR), which illustrates traveling paths of light emitted from the epitaxial layer and reflected by the DBR.
Figure 2B:
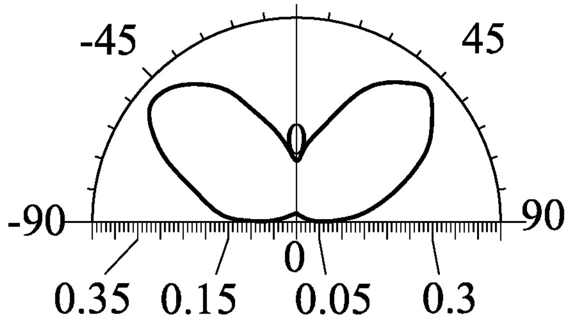
FIG.2B PRIOR ART
FIG. 2B is a light distribution curve of the conventional LED shown in FIG. 2A.

FIG. 1A shows a conventional flip chip LED, which includes a substrate 10, an epitaxial layer 11 formed on a front side of the substrate 10, and a reflective structure 12 formed on the epitaxial layer 11. The reflective structure 12 may reflect light emitted by the epitaxial layer 11 so as to make the LED to emit light from a back side (light-emitting side) of the substrate 10 that is opposite to the front side of the substrate 10. FIG. 1B shows a light distribution curve of the LED of FIG. 1A, which indicates that the LED of FIG. 1A has a relatively small light-emitting angle and exhibits poor luminous efficiency. In order to increase the light-emitting angle, the LED may further include another reflective structure 12 disposed on the back side of the substrate 10, as shown in FIG. 2A. The reflective structures 12 may each include a distributed Bragg reflector (DBR) structure and a metal layer (not shown), so as to reflect the light emitted by the epitaxial layer 11. As well known in the art, the epitaxial layer 11 may emit light at different angles, for example, light (L1) that has a small incident angle ranging from 0° to 45° and light (L2) that has a large incident angle ranging from 45° to 90°. The reflective structures 12 in the conventional LED may enable total internal reflection for both lights with small and large incident angles. The light distribution curve of the LED of FIG. 2A is shown in FIG. 2B, which indicates the LED also has a small light-emitting angle, which leads to weak side-emission and poor beam pattern. In addition, as shown in FIG. 2A, since the epitaxial layer 11 and the substrate 10 are sandwiched between the reflective structures 12, the light emitted by the epitaxial layer 11 is reflected multiple times within the LED. During this procedure, light is absorbed by the epitaxial layer 11, the metal layer, and the like. This causes a reduced light extraction and poor luminous efficiency of the LED. As a result, it is impossible to meet the display or lighting requirements.

Figure 3:
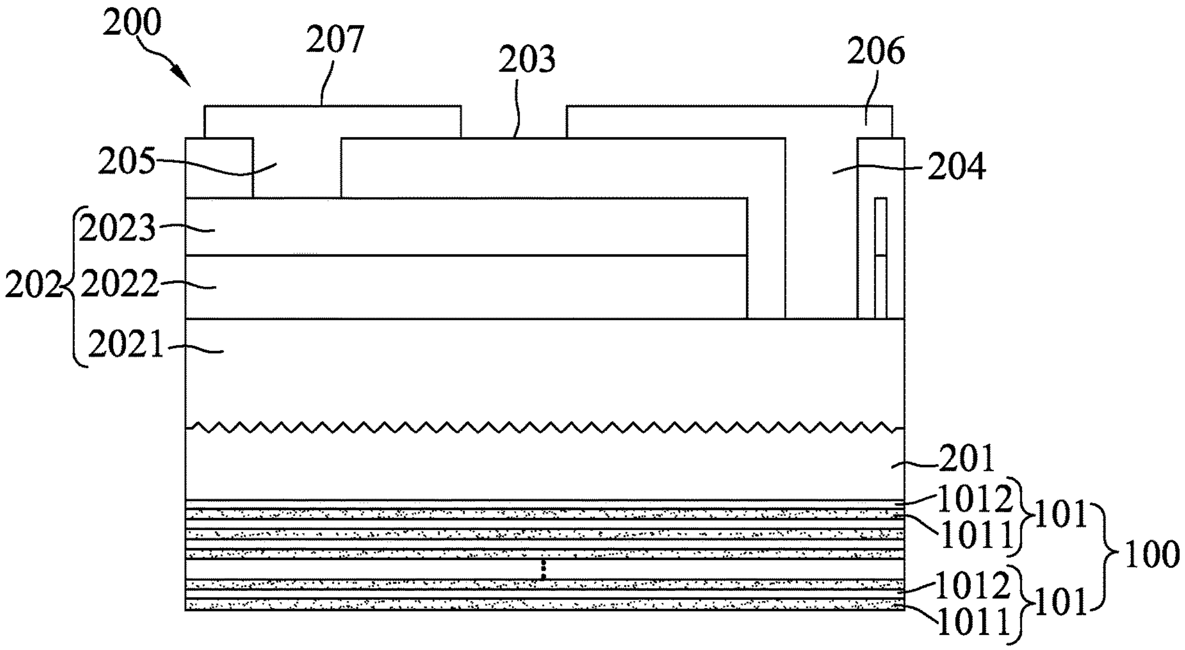
FIG. 3 is a schematic structural view of a first embodiment of a semiconductor light-emitting device according to the present disclosure.

The present disclosure provides a semiconductor light-emitting device that includes a DBR structure having a special design. The semiconductor light-emitting device according to the disclosure may be a flip chip semiconductor light-emitting device. FIG. 3 is a schematic view illustrating a first embodiment of a light-emitting device 200 in accordance with the disclosure. The light-emitting device 200 includes a light-emitting laminate 202 and a first insulating reflective structure 100 disposed on a first side of the light-emitting laminate 202. The light-emitting laminate 202 includes a first semiconductor layer 2021, a light-emitting layer 2022, and a second semiconductor layer 2023. The semiconductor light-emitting device 200 may include a first electrode 204 and a second electrode 205 disposed on a second side of the semiconductor light-emitting laminate 202 that is opposite to the first side. The first electrode 204 is electrically connected to the first semiconductor layer 2021, and the second electrode 205 is electrically connected to the second semiconductor layer 2023. Furthermore, the light-emitting device 200 may further include a first electrode pad 206 formed on and electrically connected to the first electrode 204, and a second electrode pad 207 formed on and electrically connected to the second electrode 205. The first electrode pad 206 and the second electrode pad 207 are of different polarities, and may be electrically connected to other external structures (for example, a packaging substrate, a circuit substrate, and the like).

In one embodiment, the light-emitting device 200 may further include a substrate 201 that is disposed between the semiconductor light-emitting laminate 202 and the first insulating reflective structure 100. The substrate 201 has a front side adjacent to the semiconductor light-emitting laminate 202, and a back side adjacent to the first insulating reflective structure 100. The substrate 201 may be a transparent substrate and allows light emitted from the light-emitting laminate 202 to pass through the substrate 201 and reach a surface of the first insulating reflective structure 100.

In one embodiment, the substrate 201 may be a sapphire substrate, and more specifically, a patterned sapphire substrate. The light-emitting laminate 201 may include a plurality of layers, for example, at least the first semiconductor layer 2021, the light-emitting layer 2022, and the second semiconductor layer 2023 which are formed and laminated in the above described order on the front side of the substrate 201.

The first semiconductor layer 2021 may be a nitride semiconductor layer that includes an n-type $In_xAl_yGa_{1-x-y}N$ (where $0 \le x < 1$, $0 \le y < 1$, and $0 \le x+y < 1$) and an n-type dopant such as silicon (Si). For example, the first semiconductor layer 2021 may include an n-type gallium nitride (GaN). The second semiconductor layer 2023 may be a nitride semiconductor layer that includes a p-type $In_xAl_yGa_{1-x-y}N$ (where $0 \le x < 1$, $0 \le y < 1$, and $0 \le x+y < 1$) and a p-type dopant such as magnesium (Mg). In certain embodiments, the second semiconductor layer 2023 may be a single-layered structure, or a multi-layered structure that includes layers with different components. The light-emitting layer 2022 may have a multiple quantum well (MQW) structure, where quantum well layers and quantum barrier layers are alternately stacked. For example, the quantum well layers and the quantum barrier layers may be composed of different $In_xAl_yGa_{1-x-y}N$ (where $0 \le x \le 1$, $0 \le y \le 1$, and $0 \le x+y \le 1$) materials. For example, the quantum well layers may include $In_xGa_{1-x-y}N$, where $0 < x \le 1$, and the quantum barrier layers may include GaN or AlGaN. The light-emitting layer 2022 is not limited to the MQW structure, and may have a single quantum well (SQW) structure.

The semiconductor light-emitting device 200 may further include a buffer layer (not shown) that is located between the first semiconductor layer 2021 and the substrate 201. The buffer layer may includes $In_xAl_yGa_{1-x-y}N$, where $0 \le x \le 1$ and $0 \le y \le 1$. For example, the buffer layer may include GaN, AlN, AlGaN, or InGaN. For example, the buffer layer may be formed by a plurality of layers, or has a gradient variation in its components.

In one embodiment, the first semiconductor layer 2021 may be an n-type GaN layer and the second semiconductor layer 2023 may be a p-type GaN layer. The light-emitting layer 2022 may be a multi-layered structure having alternately stacked $In_xGa_{1-x-y}N$ (where $0 < x \le 1$) and GaN or alternately stacked $In_xGa_{1-x-y}N$ (where $0 < x \le 1$) and AlGaN. The light-emitting layer 2022 emits light with a single peak emission wavelength. For example, depending on application fields of the light emitting device, e.g., luminous lighting or liquid crystal displays (LCDs), the peak emission wavelength may be designed to be ranged from 420 nm to 460 nm.

In the embodiment shown in FIG. 3, the first insulating reflective structure 100 includes n pairs of dielectric layers 101 that are successively stacked one on top of the other. Each of the n pairs of dielectric layers 101 includes a first material layer 1011 and a second material layer 1012. That is to say, the first insulating reflective structure 100 is formed by alternately stacking the first material layers 1011 and the second material layers 1012 on the first side of the light-emitting laminate 202, or more specifically, on the back side of the substrate 201. The first insulating reflective structure 100 forms the DBR structure.

In this embodiment, each of the first material layers 1011 has a first refractive index, and each of the second material layers 1012 has a second refractive index that is greater than the first refractive index. The first material layers 1011 and the second material layers 1012 may be independently formed by, for example, oxide or nitride, such as $SiO_2$, SiN, $SiO_xN_y$, $TiO_2$, $Si_3N_4$, $Al_2O_3$, TiN, AlN, $ZrO_2$, TiAlN, or TiSiN. For example, the first material layers 1011 may be formed of $SiO_2$ that has a refractive index of 1.48, and the second material layers 1012 may be formed of $TiO_2$ that has a refractive index of 2.64.

In this embodiment, the first insulating reflective structure 100 has n pairs of the dielectric layers 101, and n is a natural number ranging from 3 to 25.

To achieve wide light emitting angle and improve brightness of the light-emitting device 200, the first insulating reflective structure 100 according to the present disclosure is designed to be capable of reflecting and transmitting light at the same time. Specifically, by virtue of the first insulating reflective structure 100, light at a specific range of incident angles is reflected and light at another range of incident angles is transmitted. That is to say, when the light emitted from the light-emitting laminate 202 enters the first insulating reflective structure 100, the first insulating reflective structure 100 may: (1) cause total internal reflection of light at smaller incident angle, thereby enhancing side-emission of the light-emitting device 200 and reducing light leakage from a front side of the light-emitting device 200; (2) cause total transmission for light at larger incident angle, thereby reducing absorption of the light at larger incident angle, so as to improve light-extraction efficiency of the light-emitting device 200. To this end, for each pair of dielectric layers 101 among at least half of the n pairs of dielectric layers 101 in the first insulating reflective structure 100, an optical thickness of the first material layer 1011 is greater than that of the second material layer 1012.

In other words, for m1 pairs of dielectric layers out of the n pairs of dielectric layers 101, the optical thickness of the first material layer 1011 is greater than that of the second material layer 1012, where $0.5n \leq m1 \leq n$, and n and m1 are natural numbers greater than 0.

Figure 4:
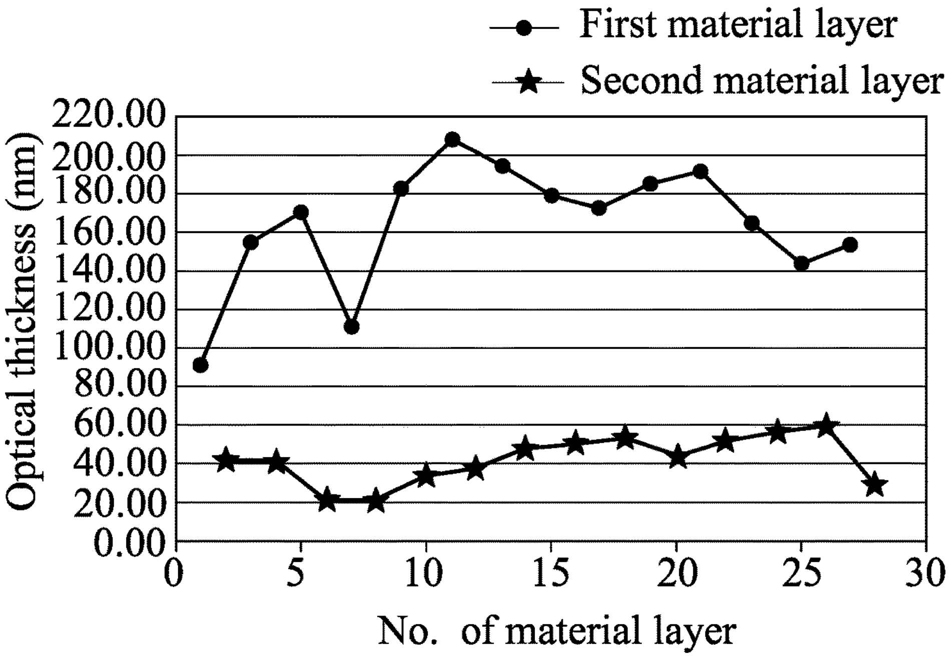
FIG. 4 shows optical thicknesses of layers contained in an insulating reflective structure of the first embodiment of the semiconductor light-emitting device shown in FIG. 3.
Figure 5:
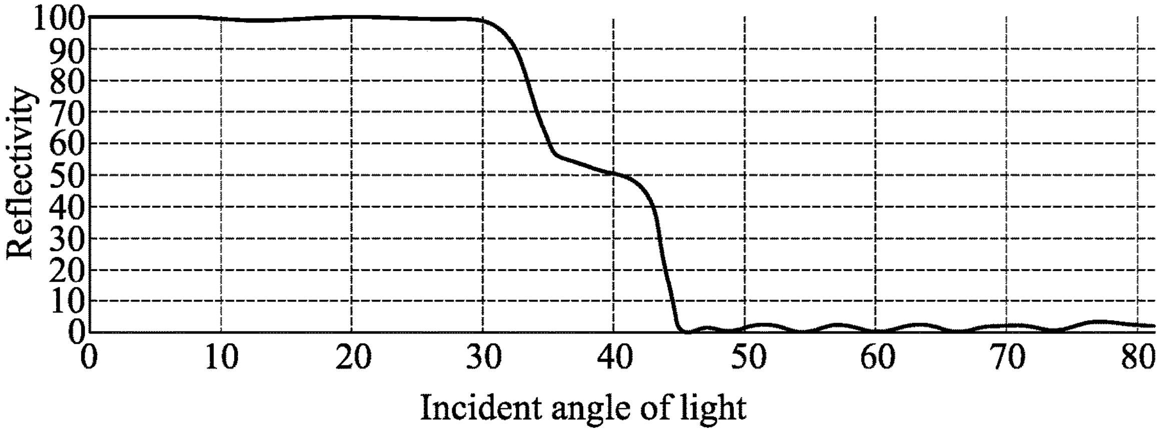
FIG. 5 shows reflectivity of lights at different incident angles, the lights being reflected by the insulating reflective structure having the configuration shown in FIG. 4.

FIG. 4 shows an example of optical thicknesses of layers in the first insulating reflective structure 100 (i.e., the DBR structure) according to the disclosure. The first insulating reflective structure 100 in which the layers have different optical thicknesses may exhibit varying reflectivity of light at different incident angles emitted from the light-emitting laminate 202. FIG. 5 shows the reflectivity of light at different incident angles. The first insulating reflective structure 100 has a first reflectivity for light emitted by the light-emitting laminate 202 at an incident angle not greater than 30°, and a second reflectivity for light emitted from the light-emitting laminate 202 at an incident angle greater than 30°. The first reflectivity is greater than the second reflectivity. Specifically, the first insulating reflective structure 100 exhibits a reflectivity of nearly 100% for light at small incident angle ranging from 0° to 20°, and further exhibits a reflectivity of not less than 90% for light at small incident angle ranging from 0° to 30°. In addition, the first insulating reflective structure 100 has low reflectivity for light at large incident angle ranging from 45° to 90°, for example, less than 10%. That is to say, light at large incident angle is almost totally transmitted. For example, the first insulating reflective structure 100 has a reflectivity not greater than 10% for light at incident angle not less than 50°.

Furthermore, as shown in FIG. 4, for each pair of dielectric layers 101 among m1 pairs of dielectric layers 101 out of the n pairs of dielectric layers 101, a difference between the optical thickness of the first material layer 1011 and the optical thickness of the second material layer 1012 may be at least 60 nm, e.g., 60 nm to 150 nm. The difference in optical thickness mentioned above may result in a decrease of transmission for the light at large incident angle.

In certain embodiments, for m1 pairs of dielectric layers 101 out of the n pairs of dielectric layers 101, the optical thickness of each of the first material layers 1011 is not necessarily equal to that of the others and may be appropriately adjusted according to desired optical reflectance or desired optical transmittance. In certain embodiments, among m1 pairs of dielectric layers 101 out of the n pairs of dielectric layers 101, the optical thicknesses of at least two of the first material layers 1011 are not equal to each other. For example, the optical thicknesses of the first material layers 1011 may gradually increase or gradually decrease from layer to layer sequentially along a stacking direction from the first side of the light-emitting laminate 202 to the second side of the light-emitting laminate 202, or the optical thicknesses of the first material layers 1011 may irregularly vary from one to another. Among m1 pairs of dielectric layers 101 out of the n pairs of dielectric layers 101, the optical thicknesses of at least two of the second material layers 1012 may not be equal to each other. For example, the optical thicknesses of the second material layers 1012 may gradually increase or gradually decrease from layer to layer sequentially along the stacking direction from the first side of the light-emitting laminate 202 to the second side of the light-emitting laminate 202, or the optical thicknesses of the second material layers 1012 may irregularly vary from one to another.

In certain embodiments, for each pair of dielectric layers 101 among m1 pairs of dielectric layers 101 out of the n pairs of dielectric layers 101, the optical thickness of each of the first material layers 1011 is greater than $\alpha/4$, and the optical thickness of each of the second material layers 1012 is smaller than $\lambda/4$, where $\lambda$ is a peak emission wavelength of light emitted by the light-emitting laminate 202 and $\lambda$ ranges from 420 nm to 460 nm. If the optical thickness of the first material layer is too great or the optical thickness of the second material layer is too small, the transmission for light at large incident angle may be decreased.

In one embodiment, the optical thickness of each of the first material layers 1011 ranges from 80 nm to 220 nm, and the optical thickness of each of the second material layer 1012 ranges from 20 nm to 70 nm.

Figure 7:
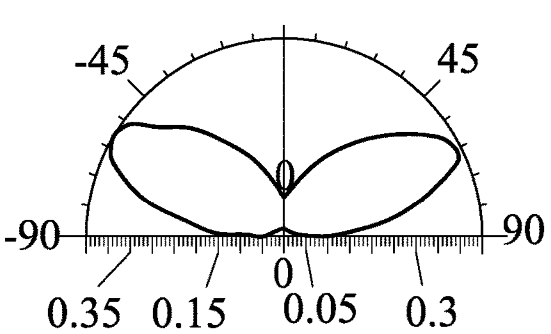
FIG. 7 is a light distribution curve of a semiconductor light-emitting device including an insulating reflective structure that has the configuration shown in FIGS. 4 and 5.

Given that there is a difference in optical thickness between the first material layers 1011 and the second material layers 1012 in the first insulating reflective structure 100 as mentioned above, when the light emitted by the light-emitting laminate 202 enters the first insulating reflective structure 100, the first insulating reflective structure 100 causes total internal reflection for light at small incident angle, thereby enhancing the side-emission of the semiconductor light-emitting device 200, as shown in FIG. 7. Therefore, the range of light-emitting angle of the light-emitting device 200 is increased, the side-emission is improved, and light leakage from front-side is reduced. Meanwhile, the first insulating reflective structure 100 also causes total transmission for light at large incident angle, thereby reducing the absorption of the light at large incident angle, so that the light efficiency of the light-emitting device 200 may be increased.

Figure 6:
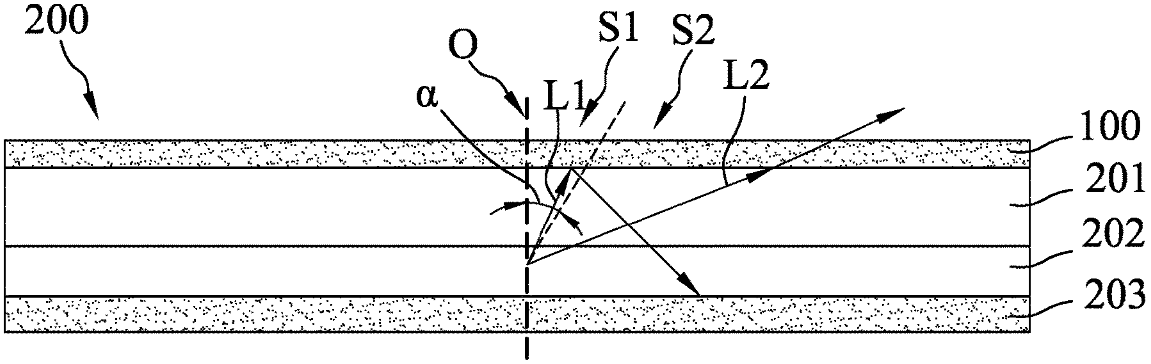
FIG. 6 illustrates a schematic view of traveling paths of light emitted from an epitaxial structure of an semiconductor light-emitting device, the semiconductor light-emitting device having an insulating reflective structure having the configuration shown in FIGS. 4 and 5.

Referring to FIG. 6, a normal line (O) is an imaginary line (shown in dashed line) that is perpendicular to the first side of the light-emitting laminate 202 and a light-emitting surface of the semiconductor light-emitting device 200, and is located at a center of the light-emitting surface. In addition, an incident angle (α) is an angle formed between the normal line (O) and an light that is emitted from the light-emitting laminate 202 into the substrate 201 and that undergoes total internal reflection due to the first insulating reflective structure 100. Furthermore, a first region S1 of the light-emitting surface of the light-emitting device 200 is defined between the normal line (O) and the light with the incident angle (α), and the remaining region on the light-emitting surface of the semiconductor light-emitting device 200 is defined as a second region (S2). In the embodiment shown in FIG. 6, the light-emitting element 200 further includes a second insulating reflective structure 203. Among the light emitted by the light-emitting laminate 202, the light (L1) at small incident angle, e.g., ranging from 0° to 30°, when traveling to reach the first insulating reflective structure 100 on the back side of the substrate 201, is totally reflected by the first insulating reflective structure 100. The reflected light, when traveling to reach the second insulating reflective structure 203, likewise, is totally reflected by the second insulating reflective structure 203. The light, after multiple times of reflection, exits from the back side of the substrate 201. On the other hand, among the light emitted by the light-emitting laminate 202, the light (L2) at large incident angle (for example, ranging from 45° to 90°), when traveling to the first insulating reflective structure 100 on the back side of the substrate 201, is totally transmitted rather than being reflected by the first insulating reflective structure 100.

In the present embodiment, the first electrode 204 and the second electrode 205 of the semiconductor light-emitting device 200 may include one or more of materials such as silver (Ag), aluminum (Al), nickel (Ni), chromium (Cr), and transparent conductive oxides (TCO).

The first electrode pad 206 and the second electrode pad 207, that are connected to the first electrode 204 and the second electrode 205, respectively, are used as external connection terminals for the semiconductor light-emitting device 200, and may include gold (Au), silver (Ag), aluminum (Al), titanium (Ti), tungsten (W), copper (Cu), tin (Sn), nickel (Ni), platinum (Pt), chromium (Cr), NiSn, TiW, AuSn, or eutectic alloys thereof. The first electrode pad 206 and the second electrode pad 207 may be connected, according to a bonding process for flip chips, to a circuit board formed with conductive traces thereon.

Referring back to FIG. 3, as mentioned above, the light-emitting laminate 202 may further include the second insulating reflective structure 203 that is formed on the second side of the light-emitting laminate 202. Similarly, the second insulating reflective structure 203 may also be a DBR structure that includes x pairs of dielectric layers that are stacked one on top of the other. Each pair of dielectric layers of the x pairs of dielectric layers includes a first material layer and a second material layer that are stacked alternately one on top the other. The optical thickness of each of the first material layers and each of the second material layers are designed such that the second insulating reflective structure 203 may cause total internal reflection of light at smaller incident angle.

In one embodiment, the second insulating reflective structure 203 has a thickness that is greater than that of the first insulating reflective structure 100. The second insulating reflective structure 203 has more pairs of dielectric layers than those of the first insulating reflective structure 100. The first insulating reflective structure 100 has a thickness generally ranging from 0.5 μm to 3 μm and includes 3 to 5 pairs of dielectric layers 101. The second insulating reflective structure 203 has a thickness generally ranging from 1.5 μm to 6 μm, and includes 10 to 25 pairs of dielectric layers. The second insulating reflective structure 203 is configured to reflect the light emitted by the light-emitting laminate 202 at either small or large incident angle to a fullest extent, so that the light is emitted out of the back side of the substrate 201. On the other hand, the first insulating reflective structure 100 only reflects a part of the light emitted by the light-emitting laminate 202. Accordingly, the second insulating reflective structure 203 may have an absolute thickness greater than that of the first insulating reflective structure 100 and have more pairs of dielectric layers than the first insulating reflective structure 100 (i.e. x is greater than n). Furthermore, since the first insulating reflective structure 100 is thinner and has fewer pairs of dielectric layers 101, the light-emitting device 200 with such a configuration may have a reduced risk of chip cracking, particularly when the first insulating reflective structure 100 is formed on the back side of the substrate 201.

In certain embodiments, the substrate 201 has a thickness not greater than 100 μm, specifically, not greater than 80 μm.

With the configuration of the first insulating reflective structure 100 and the second insulating reflective structure 203 as described above, the light transmitted through the first insulating reflective structure 100 and emitted outwardly from the first region (S1) is less than that emitted outwardly from the second region (S2). As shown in FIG. 7, the side-emission of the semiconductor light-emitting device 200 is enhanced, so that the brightness of the semiconductor light-emitting device 200 is increased.

The present disclosure provides a second embodiment of the light-emitting device 200 according to the disclosure. The light-emitting device 200 of the second embodiment has a structure similar to that of the first embodiment except for the first insulating reflective structure 100 (i.e., the DBR structure) on the back side of the substrate 201.

In the second embodiment, in addition to reflecting and transmitting the light emitted by the light-emitting laminate 202 with the peak emission wavelengths as previously described, the first insulating reflective structure 100 is designed to capable of reflecting a certain portion of an additional light having a wavelength different from that of the light emitted by the light-emitting laminate 202. In certain embodiments, the wavelength of the additional light is longer than the peak wavelength of the light emitted by the light-emitting laminate 202.

In order to overcome the failure of the stealth dicing caused by dicing laser not accurately targeting the desired depth within the substrate, an auxiliary laser is used in a process of stealth dicing to aid the dicing laser in targeting accurately. The auxiliary laser has a wavelength longer than the peak wavelength of the light emitted by the light-emitting laminate 202 and shorter than a wavelength of the dicing laser. In this embodiment, in addition to reflecting and transmitting the light emitted by the light-emitting laminate 202, the first insulating reflective structure 100 is capable of reflecting a certain portion of the auxiliary laser so as to overcome the failure of the stealth dicing caused by dicing laser not accurately targeting the desired depth within the substrate.

To be specific, in the first insulating reflective structure 100 of this embodiment, for each pair of dielectric layers 101 among the m1 pairs of dielectric layers 101, the first material layer 1011 has an optical thickness that is greater than that of the second material layer 1012, where $0.5n \le m1 < n$, n is a natural number ranging from 3 to 15, and m1 is a natural number greater than 1. In addition, among the n pairs of dielectric layers 101, m2 pairs of dielectric layers 101 are designed to reflect the auxiliary laser. In this embodiment, for each pair of dielectric layers 101 among the m2 pairs of dielectric layers 101, the first material layers 1011 has an optical thickness that is smaller than that of the second material layer 1012, where m2 is a natural number not smaller than 1, for example, 2≤m2≤0.4n.

In one embodiment, the m1 pairs of dielectric layers 101 are successively and continuously laminated in the first insulating reflective structure 100. In certain embodiments, the m1 pairs of dielectric layers (101) are discontinuously stacked. For each pair of dielectric layers 101 among the m1 pairs of dielectric layers 101, the optical thickness of first material layer 1011 is greater than that of the second material layer 1012 by at least 60 nm, for example, ranging from 60 nm to 150 nm. In one embodiment, for each pair of dielectric layers 101 among the m1 pairs of dielectric layers 101, the optical thickness of the first material layer 1011 ranges from 80 nm to 200 nm, and the optical thickness of the second material layer 1012 is smaller than 70 nm, for example, ranging from 20 nm to 70 nm.

In certain embodiments, for at least one pair of dielectric layers 101 among the m2 pairs of dielectric layers 101, the optical thickness of the first material layer 1011 ranges from 80 nm to 200 nm, and the optical thickness of the second material layer 1012 is not smaller than 200 nm, for example, ranging from 200 nm to 700 nm, or ranging from 300 nm to 600 nm.

Given that for each pair of dielectric layers 101 among the m2 pairs of dielectric layers 101 out of the n pairs of dielectric layers 101, the second material layer 1012 has an optical thickness that is significantly greater than that of the first material layer 1011, the first insulating reflective structure 100 may effectively reflect the auxiliary laser.

In one embodiment, at least two adjacent pairs of dielectric layers 101 among the m1 pairs of dielectric layers 101 are spaced apart from each other. In one embodiment, the at least two adjacent pairs of dielectric layers 101 among the m1 pairs of dielectric layers 101 in the first insulating reflective structure 100 are spaced apart by at least one pair of dielectric layers 101 among the m2 pairs of dielectric layers 101.

In this embodiment, the auxiliary laser has a wavelength ranging from 600 nm to 700 nm and is used for aiding the process of stealth dicing. The first insulating reflective structure 100 of the embodiment shown in FIG. 8 has a reflectivity of 50% or more, such as 60% to 70%, 70% to 80%, or 80% to 100%, for the auxiliary laser.

Figure 8:
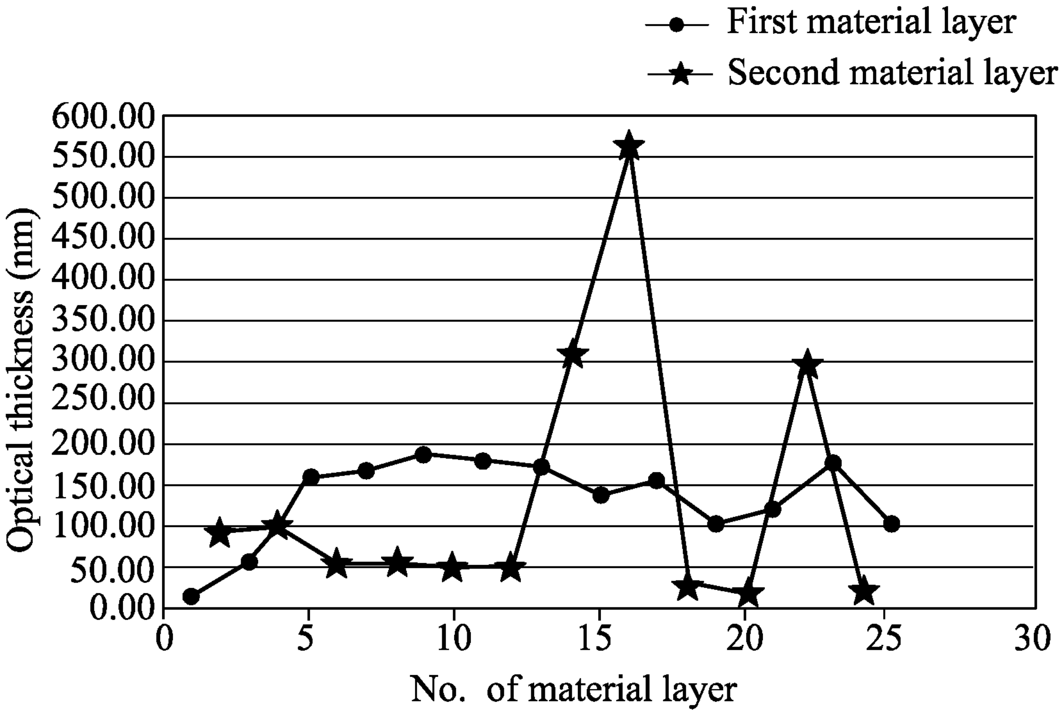
FIG. 8 shows optical thicknesses of layers contained in an insulating reflective structure of a second embodiment of the semiconductor light-emitting device according to the present disclosure.

Referring to FIG. 8, the first insulating reflective structure 100 includes 12 pairs of dielectric layers 101. In this embodiment, there are 7 pairs of dielectric layers in which the first material layer 1011 has an optical thickness that is greater than that of the second material layer 1012 (m1=7), and 5 pairs of dielectric layers in which the first material layer 1011 has an optical thickness that is smaller than that of the second material layer 1012 (m2=5).

As described above, the first insulating reflective structure 100 on the back side of the semiconductor light-emitting device of the present embodiment may not only cause total internal reflection for the light emitted by the light-emitting laminate 202 at small incident angle, but also cause total transmission for the light emitted by the light-emitting laminate 202 at large incident angle. With the thickness configuration of the m2 pairs of dielectric layers, the first insulating reflective structure 100 may further effectively reflect the auxiliary laser used for stealth dicing. Therefore, when the stealth dicing is conducted by the dicing laser, reflection of the auxiliary laser by the first insulating reflective structure 100 may aid the targeting of the dicing laser, thereby achieving accurate stealth dicing.

In this embodiment, similar to the first embodiment, the semiconductor light-emitting device 200 may further include a second insulating reflective structure 203 on the second side of the light-emitting laminate 202. As previously described, the second insulating reflective structure 203 likewise includes x pairs of dielectric layers 101 that are stacked one on top of another. Each pair of dielectric layers among the x pairs of dielectric layers 101 includes a first material layer 1011 and a second material layer 1012 that are alternately stacked one on top of another. Each of the first material layers 1011 and the second material layers 1012 has an optical thickness that is designed such that the second insulating reflective structure 203 may cause total internal reflection for the light emitted by the light-emitting laminate 202.

In addition, the second insulating reflective structure 203 in some embodiments has an absolute thickness that is greater than that of the first insulating reflective structure 100. The second insulating reflective structure 203 has more pairs of dielectric layers 101 than those of the first insulating reflective structure 100. The first insulating reflective structure 100 has a thickness generally ranging from 0.5 μm to 3 μm and includes 3 to 5 pairs of dielectric layers 101. The second insulating reflective structure 203 has a thickness generally ranging from 1.5 μm to 6 μm and includes 10 to 25 pairs of dielectric layers 101. The second insulating reflective structure 203 is configured to reflect the light emitted by the light-emitting laminate 202 at either small or large incident angle to the fullest extent, so that the light is emitted from the back side of the substrate 201 and the semiconductor light-emitting device 200. On the other hand, the first insulating reflective structure 100 only reflects the part of the light emitted by the light-emitting laminate 202. Accordingly, the second insulating reflective structure 203 may have the absolute thickness greater than that of the first reflective structure 100 and have more pairs of the dielectric layers 101 than those of the first insulating reflective structure 100 (i.e. x is greater than n). Furthermore, since the first insulating reflective structure 100 is thinner and has fewer pairs of dielectric layers 101, the semiconductor light-emitting device 200 with such a configuration may have the reduced risk of chip cracking, particularly when the first insulating reflective structure 100 is formed on the back side of the substrate 201.

In one embodiment, the substrate 201 has a thickness not greater than 100 μm, specifically, not greater than 80 μm.

Figure 9:
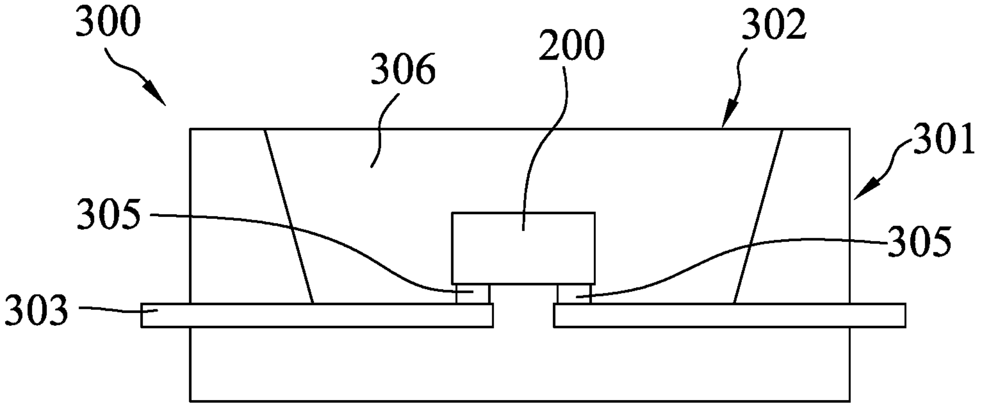
FIG. 9 is a schematic structural view of an embodiment of a semiconductor light-emitting apparatus according to the present disclosure.

The semiconductor light-emitting device 200 according to the embodiments of the disclosure may have various applications. FIG. 9 illustrates an embodiment of a semiconductor light-emitting apparatus 300 according to the disclosure. The semiconductor light-emitting apparatus 300 includes a packaging bracket 301 and the semiconductor light-emitting device 200 of one of the embodiments of this disclosure that is fixed to the packaging bracket 301. The packaging bracket 301 may be any type of packaging bracket and has a chip-fixing area. As shown in FIG. 9, the packaging bracket 301, in one embodiment, may include a packaging recess 302 for accommodating and mounting the semiconductor light-emitting device therein, and the chip-fixing area is designed in the packaging recess 302. In other embodiments, the packaging bracket 301 may be a plane bracket. As shown in FIG. 9, the packaging bracket 301 may further include an electrode layer 303 that is formed at a bottom of the packaging bracket 301. The electrode layer 303 includes two electrodes 305 that are spaced apart from each other and are respectively connected to electrodes of the semiconductor light-emitting device 200.

Referring to FIG. 9, the semiconductor light-emitting apparatus 300 may further include a packaging encapsulant 306 that is filled in the packaging recess 302 to encapsulate the semiconductor light-emitting device 200.

The light-emitting apparatus 300 including the semiconductor light-emitting device 200 according to the first embodiment or the second embodiment of the disclosure has improved side-emission and brightness.

Figure 10:
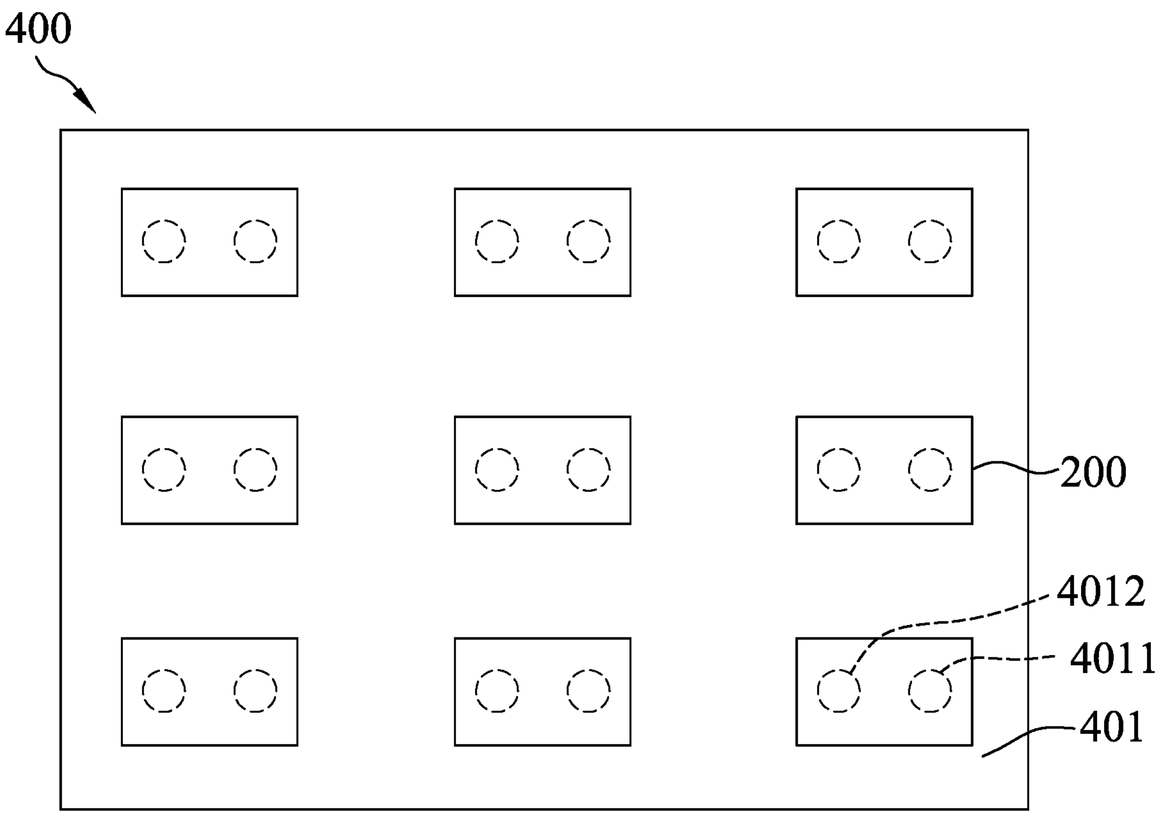
FIG. 10 is a schematic structural view of an embodiment of a display device according to the present disclosure.

FIG. 10 illustrates an embodiment of a display device 400 according to the disclosure. The display device 400 includes a circuit board 401 and a plurality of semiconductor light-emitting devices 200 of one of the embodiments of this disclosure that are electrically connected to the circuit board 401. As shown in FIG. 10, the circuit board 401 has multiple sets of electrode pads, with each set including a first bonding pad 4011 and a second bonding pad 4012. The first electrode pad 206 and the second electrode pad 207 of the semiconductor light-emitting device 200 are electrically connected to the first bonding pad 4011 and the second bonding pad 4012 on the circuit board 401, respectively, by an electrically conductive adhesive. In FIG. 10, the plurality of semiconductor light-emitting device 200 are arranged on the circuit board 401 in a matrix. However, it should be noted that the semiconductor light-emitting devices 200 may be arranged on the circuit board 401 in any suitable manner depending on actual requirements.

The semiconductor light-emitting device 200 according to the disclosure may be applied to an lighting equipment in one embodiment.

As described above, the semiconductor light-emitting device, the semiconductor light-emitting apparatus, and the display device according to the present disclosure include the above-mentioned DBR structure, and therefore, may alleviate drawbacks of the prior art and deliver beneficial effects.

Specifically, the semiconductor light-emitting device 200 of the present disclosure includes the light-emitting laminate 202 and the first insulating reflective structure 100. The first insulating reflective structure 100 includes n pairs of dielectric layers 101, and each pair of dielectric layers 101 among the n pairs of dielectric layers 101 includes the first material layer 1011 and the second material layer 1012. The first refractive index of the first material layer 1011 is greater than the second refractive index of the second material layer 1012. For each pair of dielectric layers 101 among m1 pairs of dielectric layers 101 out of the n pairs of dielectric layers 101, the optical thickness of the first material layer 1011 is greater than that of the second material layer 1012, where $n \geq m1 \geq 0.5n$. The first insulating reflective structure 100 of the above configuration may reflect the light emitted by the light-emitting laminate 202 at small incident angle (for example, ranging from 0° to 20°, or from 0° to 30°), and may transmit the light at large incident angle (for example, ranging from 45° to 90°).

Since the light at small incident angle that exits from the front side of the semiconductor light-emitting device is significantly reduced, side-emission of the semiconductor light emitting device is increased, thereby increasing range of light-emitting angle of the semiconductor light emitting device. Furthermore, because the light at large incident angle is allowed to be emitted from the front side of the semiconductor light-emitting device, absorption of light by the epitaxial layer, the metal layer, and the like is reduced, and the luminous efficiency of the chip is improved. In addition, there are, in the first insulating reflective structure 100, m2 pairs of dielectric layers 101 out of the n pairs of dielectric layers 101, in which the optical thickness of the first material layer 1011 is smaller than that of the second material layer 1012 for each pair of dielectric layers 101, as described above. In such configuration, the first insulating reflective structure 100, in addition to causing total internal reflection for light at small incident angle and total transmission for light at large incident angle, may reflect at least 50% of light with a wavelength ranging from 600 nm to 700 nm. For example, the first insulating reflective structure 100 may have a reflectivity of at least 50% for the auxiliary laser with the wavelength of 650 nm. Therefore, with the aiding of the auxiliary laser with such wavelength, a laser dicing machine may benefit from the above configuration of the semiconductor light-emitting device according to the disclosure for dicing operation.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:

a light-emitting laminate, and a first insulating reflective structure including n pairs of dielectric layers stacked on said light-emitting laminate, each of the n pairs of dielectric layers including a first material layer having a first refractive index, and a second material layer having a second refractive index that is greater than the first refractive index of the first material layer;

wherein for each pair of dielectric layers among m1 pairs of dielectric layers out of the n pairs of dielectric layers, the first material layer has an optical thickness that is greater than an optical thickness of the second material layer, where 0.5n≤m1≤n, and n and ml are natural numbers greater than 0, and wherein for each pair of dielectric layers among m2 pairs of dielectric layers out of the n pairs of dielectric layers, the optical thickness of the first material layer is smaller than the optical thickness of the second material layer, where m2 is a natural number not smaller than 1, and wherein for at least one pair of dielectric layers among the m2 pairs of dielectric layers, the optical thickness of the first material layer ranges from 80 nm to 200 nm, and the optical thickness of the second material layer is not smaller than 200 nm.

2. The light-emitting device according to claim 1, wherein for each of the ml pairs of dielectric layers, the optical thickness of the first material layer is greater than the optical thickness of the second material layer by at least 60 nm.

3. The light-emitting device according to claim 1, wherein the optical thickness of the first material layer in each of the ml pairs of dielectric layers ranges from 80 nm to 220 nm.

4. The light-emitting device according to claim 1, wherein the optical thickness of the second material layer in each of the ml pairs of dielectric layers ranges from 20 nm to 70 nm.

5. The light-emitting device according to claim 1, wherein the optical thickness of the first material layer in each of the ml pairs of dielectric layers is greater than λ/4,λ being a peak emission wavelength of light emitted by the light-emitting laminate and ranging from 420 nm to 460 nm.

6. The light-emitting device according to claim 1, wherein the optical thickness of the second material layer in each of the ml pairs of dielectric layers is smaller than λ/4,λ being a peak emission wavelength of light emitted by the light-emitting laminate and ranging from 420 nm to 460 nm.

7. The light-emitting device according to claim 1, wherein the ml pairs of dielectric layers are successively and continuously stacked.

8. The light-emitting device according to claim 1, wherein the ml pairs of dielectric layers are discontinuously stacked.

9. The light-emitting device according to claim 1, wherein m2 is not greater than 0.4n.

10. The light-emitting device according to claim 1, wherein the optical thickness of the second material layer in each of the m2 pairs of dielectric layers ranges from 200 nm to 700 nm.

11. The light-emitting device according to claim 1, wherein n ranges from 3 to 25.

12. The light-emitting device according to claim 1, wherein ml is equal to n.

13. The light-emitting device according to claim 1, wherein m2 is not smaller than 2.

14. The light-emitting device according to claim 1, further comprising a transparent substrate disposed between the light-emitting laminate and the first insulating reflective structure.

15. The light-emitting device according to claim 1, further comprises a second insulating reflective structure disposed on a side of the light-emitting laminate that is away from the first insulating reflective structure.

16. The light-emitting device according to claim 15, wherein the second insulating reflective structure includes x pairs of reflective dielectric layers that are stacked on one another, where x is greater than n.

17. The light-emitting device according to claim 15, wherein the second insulating reflective structure has an absolute thickness greater than an absolute thickness of the first insulating reflective structure.

18. The light-emitting device according to claim 1, further comprising electrode pads that have different polarities and that are disposed on a side of the light-emitting laminate that is away from the first insulating reflective structure.

* * * * *